US005962995A

United States Patent [19]

Avnery

[11] Patent Number: 5,962,995

[45] Date of Patent: Oct. 5, 1999

[54] ELECTRON BEAM ACCELERATOR

[75] Inventor: Tzvi Avnery, Winchester, Mass.

[73] Assignee: Applied Advanced Technologies, Inc., Wilmington, Mass.

[21] Appl. No.: 08/778,037

[22] Filed: Jan. 2, 1997

[51] Int. Cl.[6] .............................. H05H 5/03; H01J 33/04; H01J 37/063; G21K 5/04

[52] U.S. Cl. ....................... 315/506; 313/363.1; 313/420; 250/492.3

[58] Field of Search .................................... 315/500, 506, 315/111.81; 313/62, 363.1, 420; 250/492.3

[56] References Cited

U.S. PATENT DOCUMENTS

| | | | |
|---|---|---|---|
| 3,433,947 | 3/1969 | Emanuelson et al. | 250/442.11 |
| 3,440,466 | 4/1969 | Collin et al. | 313/35 |
| 3,610,993 | 10/1971 | Randels | 313/42.1 |
| 3,617,740 | 11/1971 | Skillicorn | 378/110 |
| 3,749,967 | 7/1973 | Douglas-Hamilton et al. | 315/85 |
| 3,863,163 | 1/1975 | Farrell et al. | 328/233 |
| 3,956,712 | 5/1976 | Hant | 372/74 |
| 4,020,354 | 4/1977 | Fauss et al. | 250/492.3 |
| 4,061,944 | 12/1977 | Gay | 313/420 |
| 4,079,328 | 3/1978 | Cleland et al. | 315/500 |
| 4,143,272 | 3/1979 | Frank | 250/425 |
| 4,246,297 | 1/1981 | Nablo et al. | 427/505 |
| 4,446,374 | 5/1984 | Ivanov et al. | 250/492.3 |
| 4,468,282 | 8/1984 | Neukermans | 216/27 |
| 4,499,405 | 2/1985 | Loda | 315/13.1 |
| 4,584,468 | 4/1986 | Van De Wiel | 250/214 VT |
| 4,646,338 | 2/1987 | Skillicorn | 378/110 |
| 4,703,234 | 10/1987 | Kato | 315/5.41 |
| 4,705,988 | 11/1987 | Tran et al. | 315/4 |
| 4,746,909 | 5/1988 | Israel et al. | 340/568.1 |
| 4,910,435 | 3/1990 | Wakalopulos | 315/111.31 |
| 4,957,835 | 9/1990 | Aden | 430/5 |
| 5,003,178 | 3/1991 | Livesay | 250/492.3 |
| 5,004,952 | 4/1991 | Ikes et al. | 315/3.5 |
| 5,093,602 | 3/1992 | Kelly | 313/231.01 |
| 5,126,633 | 6/1992 | Avnery et al. | 315/14 |
| 5,236,159 | 8/1993 | Avnery et al. | 248/74.2 |
| 5,254,911 | 10/1993 | Avnery et al. | 315/366 |
| 5,378,898 | 1/1995 | Schonberg et al. | 250/492.3 |
| 5,382,802 | 1/1995 | Anabuki et al. | 250/492.1 |
| 5,414,267 | 5/1995 | Wakalopulos | 250/492.3 |
| 5,483,074 | 1/1996 | True | 250/423 R |
| 5,561,298 | 10/1996 | Cirlin et al. | 250/423 R |
| 5,561,342 | 10/1996 | Roeder et al. | 313/420 |
| 5,631,471 | 5/1997 | Anderl et al. | 250/492.3 |

*Primary Examiner*—Edward P. Westin
*Assistant Examiner*—Shane R. Gardner
*Attorney, Agent, or Firm*—Hamilton, Brook, Smith & Reynolds, P.C.

[57] ABSTRACT

An electron accelerator includes a vacuum chamber having an electron beam exit window. An electron generator is positioned within the vacuum chamber for generating electrons. A housing surrounds the electron generator and has a first series of openings formed in the housing between the electron generator and the exit window for allowing electrons to accelerate from the electron generator out the exit window in an electron beam when a voltage potential is applied between the housing and the exit window. The housing also has a second series and third series of openings formed in the housing on opposite sides of the electron generator for causing electrons to be uniformly distributed across the electron beam by flattening electrical field lines between the electron generator and the exit window.

40 Claims, 6 Drawing Sheets

ELECTRON BEAM ACCELERATOR

BACKGROUND

Electron beams are used in many industrial processes such as for drying or curing inks, adhesives, paints and coatings. Electron beams are also used for liquid, gas and surface sterilization as well as to clean up hazardous waste.

Conventional electron beam machines employed for industrial purposes include an electron beam accelerator which directs an electron beam onto the material to be processed. The accelerator has a large lead encased vacuum chamber containing an electron generating filament or filaments powered by a filament power supply. During operation, the vacuum chamber is continuously evacuated by vacuum pumps. The filaments are surrounded by a housing having a grid of openings which face a metallic foil electron beam exit window positioned on one side of the vacuum chamber. A high voltage potential is imposed between the filament housing and the exit window with a high voltage power supply. Electrons generated by the filaments accelerate from the filaments in an electron beam through the grid of openings in the housing and out through the exit window. An extractor power supply is typically included for flattening electric field lines in the region between the filaments and the exit window. This prevents the electrons in the electron beam from concentrating in the center of the beam as depicted in graph 1 of FIG. 1, and instead, evenly disperses the electrons across the width of the beam as depicted in graph 2 of FIG. 1.

The drawback of employing electron beam technology in industrial situations is that conventional electron beam machinery is complex and requires personnel highly trained in vacuum technology and accelerator technology for maintaining the machinery. For example, during normal use, both the filaments and the electron beam exit window foil must be periodically replaced. Such maintenance must be done on site because the accelerator is very large and heavy (typically 20 inches to 30 inches in diameter by 4 feet to 6 feet long and thousands of pounds). Replacement of the filaments and exit window requires the vacuum chamber to be opened, causing contaminants to enter. This results in long down times because once the filaments and exit window foil are replaced, the accelerator must be evacuated and then conditioned for high voltage operation before the accelerator can be operated. Conditioning requires the power from the high voltage power supply to be gradually raised over time to burn off contaminants within the vacuum chamber and on the surface of the exit window which entered when the vacuum chamber was opened. This procedure can take anywhere between two hours and ten hours depending on the extent of the contamination. Half the time, leaks in the exit window occur which must be remedied, causing the time of the procedure to be further lengthened. Finally, every one or two years, a high voltage insulator in the accelerator is replaced, requiring disassembly of the entire accelerator. The time required for this procedure is about 2 to 4 days. As a result, manufacturing processes requiring electron beam radiation can be greatly disrupted when filaments, electron beam exit window foils and high voltage insulators need to be replaced.

SUMMARY OF THE INVENTION

The present invention provides a compact less complex electron accelerator for an electron beam machine which allows the electron beam machine to be more easily maintained and does not require maintenance by personnel highly trained in vacuum technology and accelerator technology. The electron accelerator of the present invention includes a vacuum chamber having an electron beam exit window. An electron generator is positioned within the vacuum chamber for generating electrons. A housing surrounds the electron generator and has a first series of openings formed in the housing between the electron generator and the exit window for allowing electrons to accelerate from the electron generator out the exit window in an electron beam when a voltage potential is applied between the housing and the exit window. The housing also has a second series and a third series of openings formed in the housing on opposite sides of the electron generator for causing electrons to be uniformly distributed across the electron beam by flattening electrical field lines between the electron generator and the exit window.

In preferred embodiments, the vacuum chamber is formed within a cylindrical member which has a longitudinal axis and an outer wall. A disk-shaped high voltage insulator separates the vacuum chamber from a high voltage connector which supplies power to the electron generator and the housing. Only two leads extend from the high voltage connector and pass through the insulator for electrically connecting the high voltage connector to the electron generator and the housing. The electron generator preferably comprises a filament. The exit window is preferably formed of titanium foil under 12.5 microns thick with about 6 to 12 microns thick being more preferred and about 8 to 10 microns being the most preferred. The exit window has an outer edge which is either brazed, welded or bonded to the vacuum chamber to provide a gas tight seal therebetween. The vacuum chamber is hermetically sealed to provide a permanent self sustained vacuum therein. A sealable outlet is coupled to the vacuum chamber for evacuating the vacuum chamber. A support plate is mounted to the vacuum chamber for supporting the exit window. The electron beam generated by the electron accelerator is substantially non-focused. In one preferred embodiment, the exit window is positioned perpendicular to the longitudinal axis of the vacuum chamber. In another preferred embodiment, the exit window is position parallel to the longitudinal axis of the vacuum chamber.

The present invention also provides an electron beam system including a first electron beam accelerator for producing a first electron beam. A second electron beam accelerator is included for producing a second electron beam. The second accelerator is offset from the first accelerator backwardly and sidewardly to provide uninterrupted accumulative lateral electron beam coverage on an object moving under the system's electron beams.

The present invention provides a compact replaceable modular electron beam accelerator. The entire accelerator is replaced when the filaments or the electron beam exit window require replacing, thus drastically reducing the down time of an electron beam machine. This also eliminates the need for personnel skilled in vacuum technology and electron accelerator technology for maintaining the machine. In addition, the high voltage insulator usually does not need to be replaced on site. Furthermore, the inventive electron beam accelerator has less components and requires less power than conventional electron beam accelerators, making it less expensive, simpler, smaller and more efficient. The compact size of the accelerator makes it suitable for use in machines where space is limited such as in small printing presses, or for in line web sterilization and interstation curing.

BRIEF DESCRIPTION OF THE DRAWINGS

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 2:
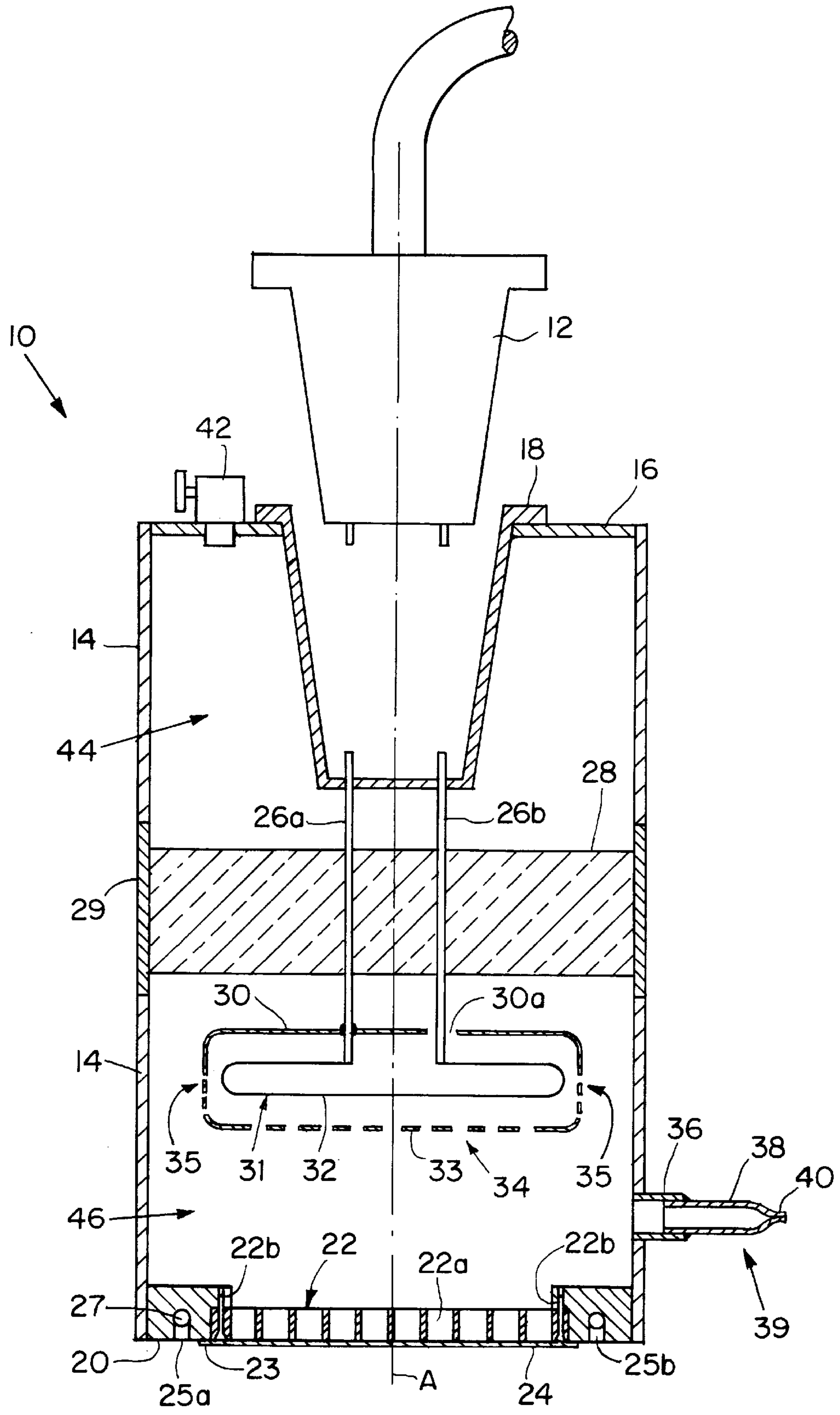
FIG. 2 is a side sectional schematic drawing of the present invention electron beam accelerator.
Figure 3:
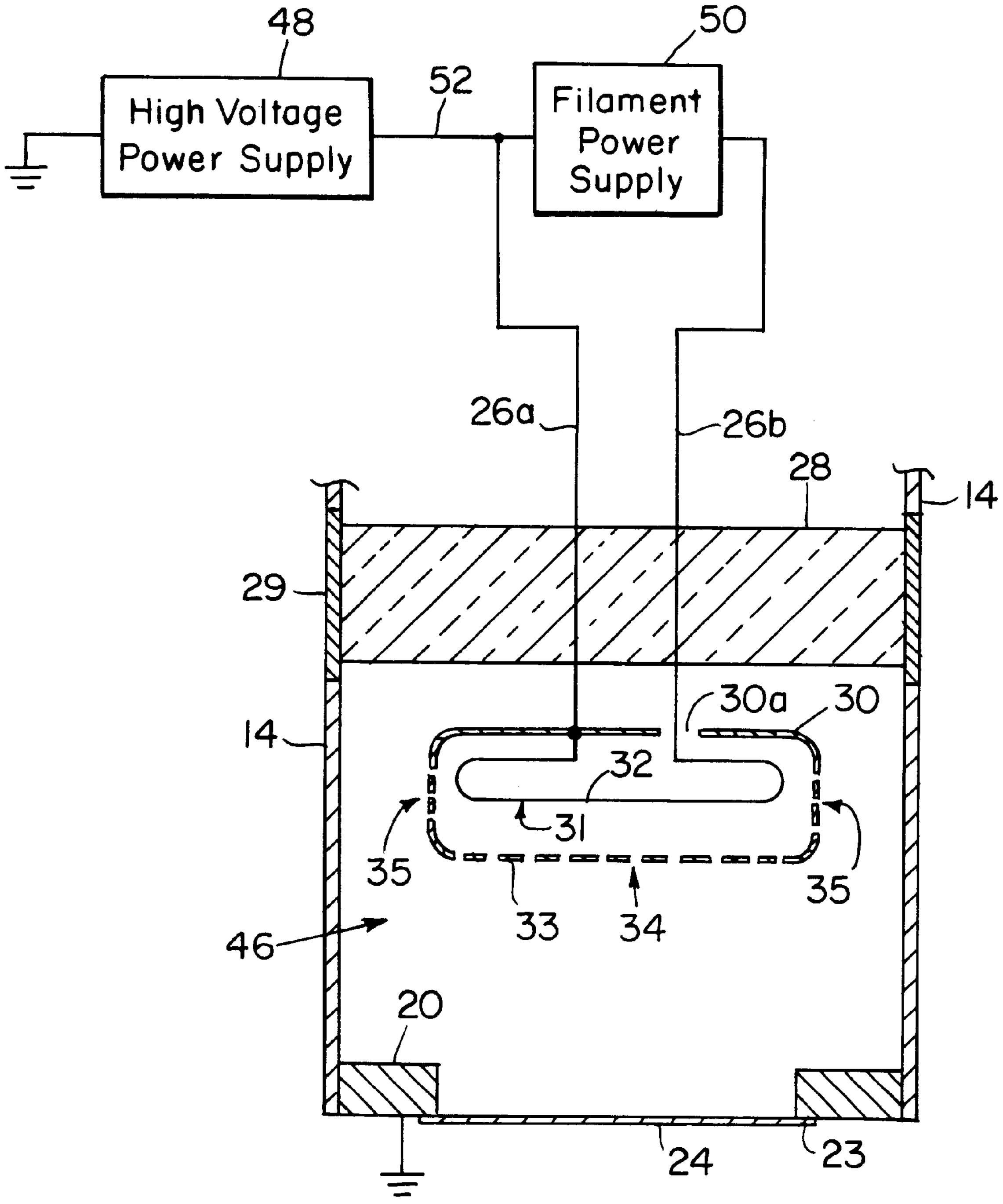
FIG. 3 is a schematic drawing showing the power connections of the accelerator of FIG. 2.

Referring to FIGS. 2 and 3, electron beam accelerator 10 is a replaceable modular accelerator which is installed in an electron beam machine housing (not shown). Accelerator 10 includes an elongate generally cylindrical two piece outer shell 14 which is sealed at both ends. The proximal end of outer shell 14 is enclosed by a proximal end cap 16 which is welded to outer shell 14. Outer shell 14 and end cap 16 are each preferably made from stainless steel but alternatively can be made of other suitable metals.

The distal end of accelerator 10 is enclosed by an electron beam exit window membrane 24 made of titanium foil which is brazed along edge 23 to a stainless steel distal end cap 20. End cap 20 is welded to outer shell 14. Exit window 24 is typically between about 6 to 12 microns thick with about 8 to 10 microns being the more preferred range. Alternatively, exit window 24 can be made of other suitable metallic foils such as magnesium, aluminum, beryllium or suitable non-metallic low density materials such as ceramics. In addition, exit window 24 can be welded or bonded to end cap 20. A rectangular support plate 22 having holes or openings 22*a* for the passage of electrons therethrough is bolted to end cap 20 with bolts 22*b* and helps support exit window 24. Support plate 22 is preferably made of copper for dissipating heat but alternatively can be made of other suitable metals such as stainless steel, aluminum or titanium. The holes 22*a* within support plate 22 are about ⅛ inch in diameter and provide about an 80% opening for electrons to pass through exit window 24. End cap 20 includes a cooling passage 27 through which cooling fluid is pumped for cooling the end cap 20, support plate 22 and exit window 24. The cooling fluid enters inlet port 25*a* and exits outlet port 25*b*. The inlet 25*a* and outlet 25*b* ports mate with coolant supply and return ports on the electron beam machine housing. The coolant supply and return ports include "O" ring seals for sealing to the inlet 25*a* and outlet 25*b* ports. Accelerator 10 is about 12 inches in diameter by 20 inches long and about 50 pounds in weight.

A high voltage electrical connecting receptacle 18 for accepting the connector 12 of a high voltage power cable is mounted to end cap 16. The high voltage cable supplies accelerator 10 with power from a high voltage power supply 48 and a filament power supply 50. High voltage power supply 48 preferably provides about 100 kv but alternatively can be higher or lower depending upon the thickness of exit window 24. Filament power supply 50 preferably provides about 15 volts. Two electrical leads 26*a*/26*b* extend downwardly from receptacle 18 through a disk-shaped high voltage ceramic insulator 28 which divides accelerator 10 into an upper insulating chamber 44 and a lower vacuum chamber 46. Insulator 28 is bonded to outer shell 14 by first being brazed to an intermediate ring 29 made of material having an expansion coefficient similar to that of insulator 28 such as KOVAR®. The intermediate ring 29 can then be brazed to the outer shell 14. The upper chamber 44 is evacuated and then filled with an insulating medium such as $SF_6$ gas but alternatively can be filled with oil or a solid insulating medium. The gaseous and liquid insulating media can be filled and drained through shut off valve 42.

An electron generator 31 is positioned within vacuum chamber 46 and preferably consists of three 8 inch long filaments 32 (FIG. 4) made of tungsten which are electrically connected together in parallel. Alternatively, two filaments 32 can be employed. The electron generator 31 is surrounded by a stainless steel filament housing 30. Filament housing 30 has a series of grid like openings 34 along a planar bottom 33 and a series of openings 35 along the four sides of housing 30. The filaments are preferably positioned within housing 30 about midway between bottom 33 and the top of housing 30. Openings 35 do not extend substantially above filaments 32.

Electrical lead 26*a* and line 52 electrically connect filament housing 30 to high voltage power supply 48. Electrical lead 26*b* passes through a hole 30*a* in filament housing 30 to electrically connect filaments 32 to filament power supply 50. The exit window 24 is electrically grounded to impose a high voltage potential between filament housing 30 and exit window 24.

An inlet 39 is provided on vacuum chamber 46 for evacuating vacuum chamber 46. Inlet 39 includes a stainless steel outer pipe 36 which is welded to outer shell 14 and a sealable copper tube 38 which is brazed to pipe 36. Once vacuum chamber 46 is evacuated, pipe 38 is cold welded under pressure to form a seal 40 for hermetically sealing vacuum chamber 46.

Figure 4:
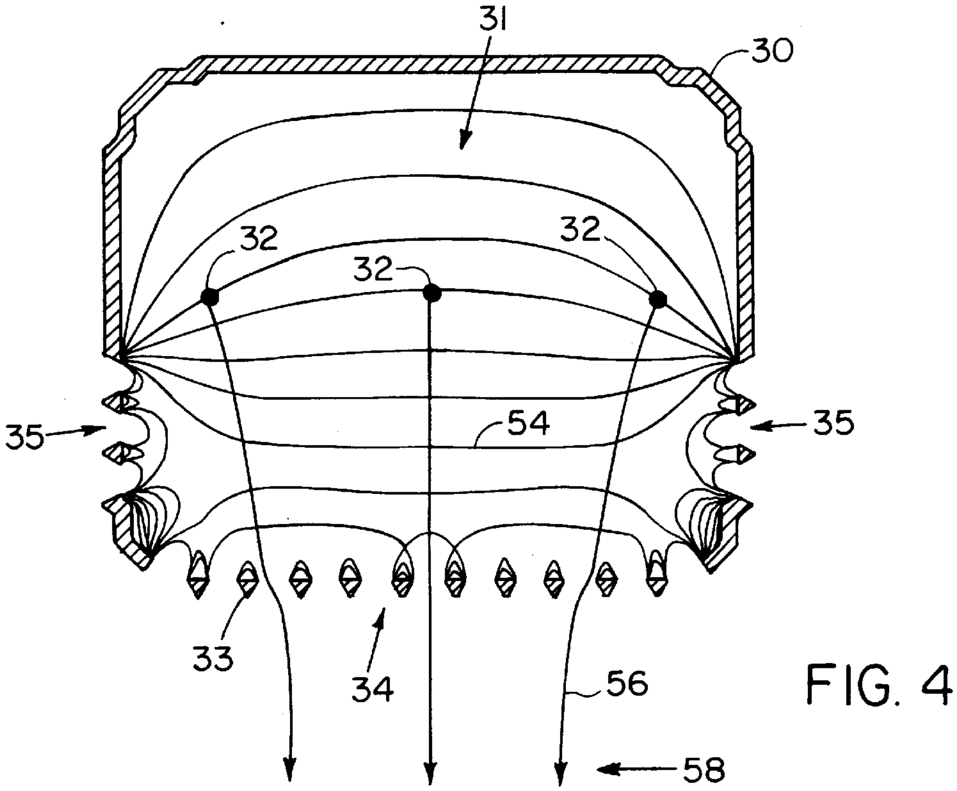
FIG. 4 is an end sectional view of the filament housing showing electric field lines.

In use, accelerator 10 is mounted to an electron beam machine, and electrically connected to connector 12. The housing of the electron beam machine includes a lead enclosure which surrounds accelerator 10. Filaments 32 are heated up to about 4200° F. by electrical power from filament power supply 50 (AC or DC) which causes free electrons to form on filaments 32. The high voltage potential between the filament housing 30 and exit window 24 imposed by high voltage power supply 48 causes the free electrons 56 on filaments 32 to accelerate from the filaments 32 in an electron beam 58 out through openings 34 in housing 30 and the exit window 24 (FIG. 4).

Figure 1:
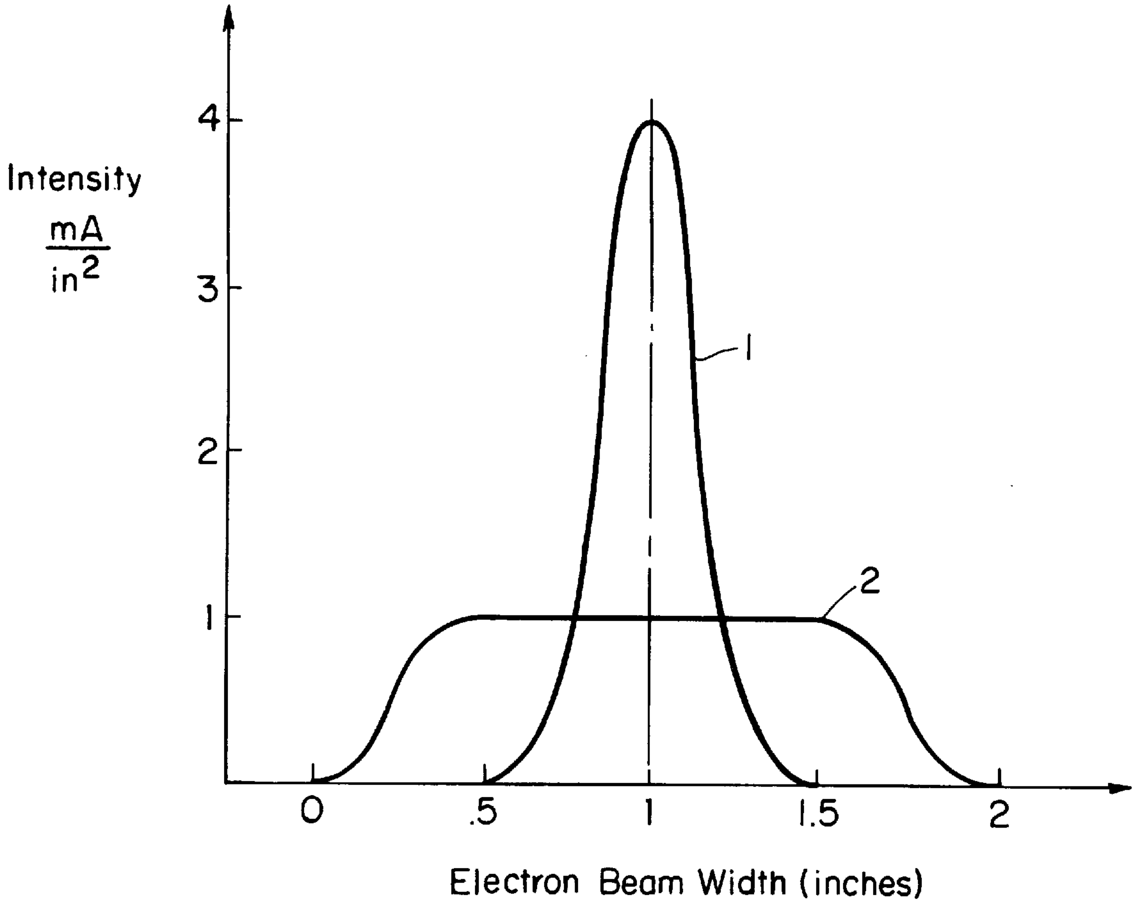
FIG. 1 is a graph depicting the distribution of electrons in a focused electron beam superimposed over a graph depicting the distribution of electrons in an electron beam where the electrons are uniformly distributed across the width of the beam.
Figure 5:
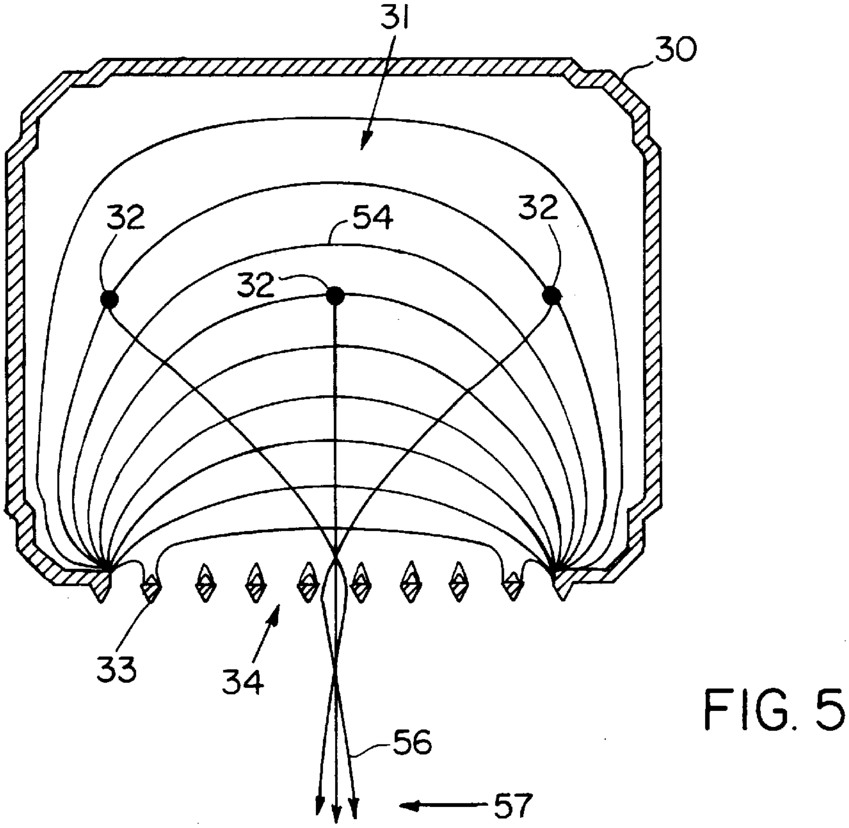
FIG. 5 is an end sectional view of the filament housing showing electric field lines if the side openings 35 are omitted.

The side openings 35 create small electric fields around the openings 35 which flatten the high voltage electric field lines 54 between the filaments 32 and the exit window 24 relative to the plane of the bottom 33 of housing 30. By flattening electric field lines 54, electrons 56 of electron beam 58 exit housing 30 through openings 34 in a relatively straight manner rather than focusing towards a central location as depicted by graph 1 of FIG. 1. This results in a broad electron beam 58 about 2 inches wide by 8 inches long having a profile which is similar to that of graph 2 of FIG. 1. The narrower higher density electron beam of graph 1 of FIG. 1 is undesirable because it will burn a hole through exit window 24. To further illustrate the function of side openings 35, FIG. 5 depicts housing 30 with side openings 35 omitted. As can be seen, without side openings 35, electric field lines 54 arch upwardly. Since electrons 56 travel about perpendicularly to the electric field lines 54, the electrons 56 are focused in a narrow electron beam 57. In contrast, as seen in FIG. 4, the electric field lines 54 are flat allowing the electrons 56 to travel in a wider substantially non-focusing electron beam 58. Accordingly, while conventional accelerators need to employ an extractor power supply at high voltage to flatten the high voltage electric field lines for evenly dispersing the electrons across the electric beam, the present invention is able to accomplish the same results in a simple and inexpensive manner by means of the openings 35.

When the filaments 32 or exit window 24 need to be replaced, the entire accelerator 10 is simply disconnected from the electron beam machine housing and replaced with a new accelerator 10. The new accelerator 10 is already preconditioned for high voltage operation and, therefore, the down time of the electron beam machine is merely minutes. Since only one part needs to be replaced, the operator of the electron beam machine does not need to be highly trained in vacuum technology and accelerator technology maintenance. In addition, accelerator 10 is small enough and light enough in weight to be replaced by one person.

In order to recondition the old accelerator 10, the old accelerator is preferably sent to another location such as a company specializing in vacuum technology. First, the vacuum chamber 46 is opened by removing the exit window 24 and support plate 22. Next, housing 30 is removed from vacuum chamber 46 and the filaments 32 are replaced. If needed, the insulating medium within upper chamber 44 is removed through valve 42. The housing 30 is then remounted back in vacuum chamber 46. Support plate 22 is bolted to end cap 20 and exit window 24 is replaced. The edge 23 of the new exit window 24 is brazed to end cap 20 to form a gas tight seal therebetween. Since exit window 24 covers the support plate 22, bolts **22*b* and bolt holes, it serves the secondary function of sealing over the support plate 22 without any leaks, "O"-rings or the like. Copper tube 38 is removed and a new copper tube 38 is brazed to pipe 36. These operations are performed in a controlled clean air environment so that contamination within vacuum chamber and on exit window 24** are substantially eliminated.

By assembling accelerator 10 within a clean environment, the exit window 24 can be easily made 8 to 10 microns thick or even as low as 6 microns thick. The reason for this is that dust or other contaminants are prevented from accumulating on exit window 24 between the exit window 24 and the support plate 22. Such contaminants will poke holes through an exit window 24 having a thickness under 12.5 microns. In contrast, electron beam exit windows in conventional accelerators must be 12.5 to 15 microns thick because they are assembled at the site in dusty conditions during maintenance. An exit window 12.5 to 15 microns thick is thick enough to prevent dust from perforating the exit window. Since the present invention exit window 24 is typically thinner than exit windows on conventional accelerators, the power required for accelerating electrons through the exit window 24 is considerably less. For example, about 150 kv is required in conventional accelerators for accelerating electrons through an exit window 12.5 to 15 microns thick. In contrast, in the present invention, only about 80 kv to 125 kv is required for an exit window about 8 to 10 microns thick.

As a result, for a comparable electron beam, accelerator 10 is more efficient than conventional accelerators. In addition, the lower voltage also allows the accelerator 10 to be more compact in size and allows a disk-shaped insulator 28 to be used which is smaller than the cylindrical or conical insulators employed in conventional accelerators. The reason accelerator 10 can be more compact then conventional accelerators is that the components of accelerator 10 can be closer together due to the lower voltage. The controlled clean environment within vacuum chamber 46 allows the components to be even closer together. Conventional accelerators operate at higher voltages and have more contaminants within the accelerator which requires greater distances between components to prevent electrical arcing therebetween. In fact, contaminants from the vacuum pumps in conventional accelerators migrate into the accelerator during use.

The vacuum chamber 46 is then evacuated through inlet 39 and tube 38 is hermetically sealed by cold welding. Once vacuum chamber 46 is sealed, vacuum chamber 46 remains under a permanent vacuum without requiring the use of an active vacuum pump. This reduces the complexity and cost of operating the present invention accelerator 10. The accelerator 10 is then preconditioned for high voltage operation by connecting the accelerator 10 to an electron beam machine and gradually increasing the voltage to burn off any contaminants within vacuum chamber 46 and on exit window 24. Any molecules remaining within the vacuum chamber 46 are ionized by the high voltage and/or electron beam and are accelerated towards housing 30. The ionized molecules collide with housing 30 and become trapped on the surfaces of housing 30, thereby further improving the vacuum. The vacuum chamber 46 can also be evacuated while the accelerator 10 is preconditioned for high voltage operation. The accelerator 10 is disconnected from the electron beam machine and stored for later use.

Figure 6:
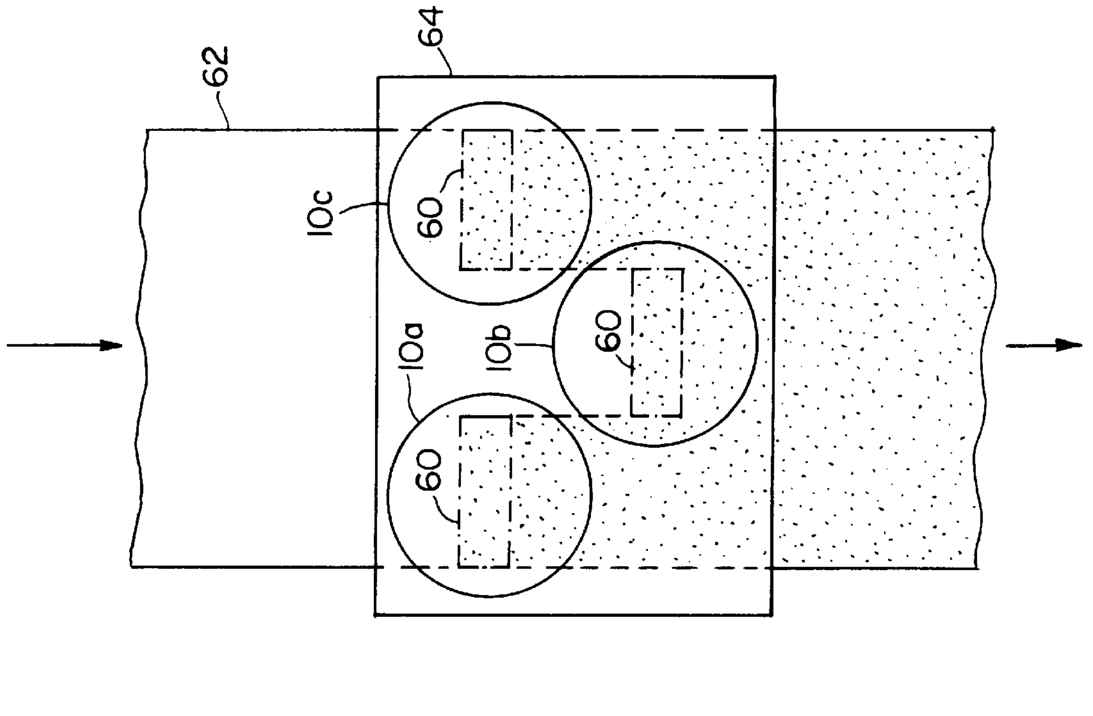
FIG. 6 is a plan view of a system incorporating more than one electron beam accelerator.

FIG. 6 depicts a system 64 including three accelerators **10*a*, 10*b* and 10*c* which are staggered relative to each other to radiate the entire width of a moving product 62 with electron beams 60. Since the electron beam 60 of each accelerator 10*a*, 10*b*, 10*c* is narrower than the outer diameter of an accelerator, the accelerators cannot be positioned side-by-side. Instead, accelerator 10*b* is staggered slightly to the side and backwards relative to accelerators 10*a* and 10*c* along the line of movement of the product 62 such that the ends of each electron beam 60 will line up with each other in the lateral direction. As a result, the moving product 62 can be accumulatively radiated by the electron beams 60 in a step-like configuration as shown. Although three accelerators have been shown, alternatively, more than three accelerators 10 can be staggered to radiate wider products or only two accelerators 10** can be staggered to radiate narrower products.

Figure 7:
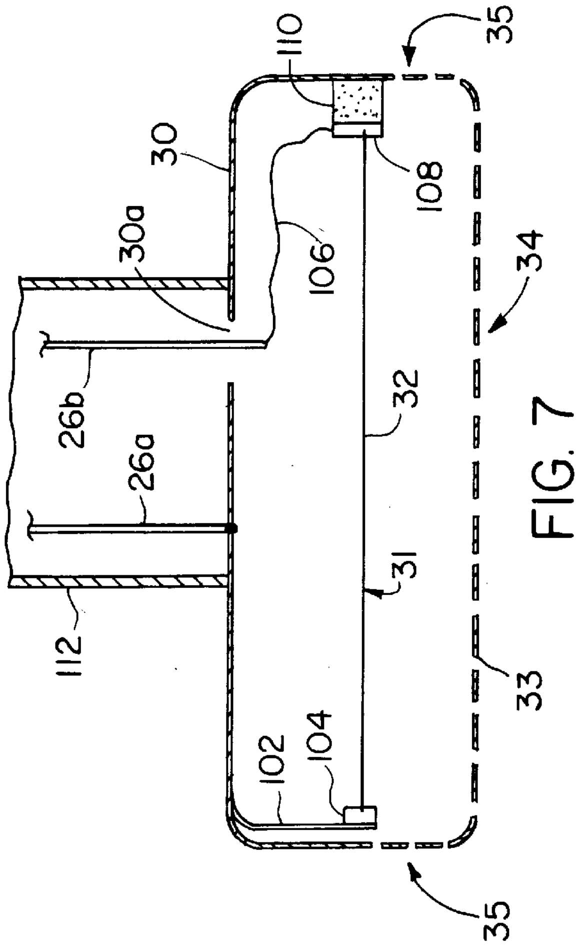
FIG. 7 is a side sectional schematic drawing of the filament housing showing another preferred method of electrically connecting the filaments.
Figure 8:
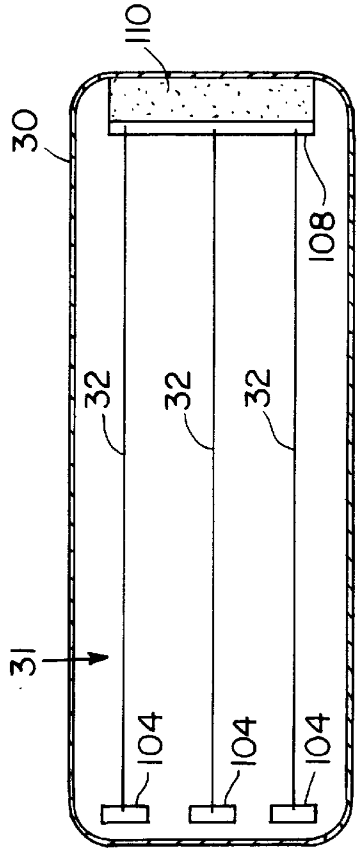
FIG. 8 is a bottom sectional schematic drawing of FIG. 7.

FIGS. 7 and 8 depict another preferred method of electrically connecting leads **26*a* and 26*b* to filament housing 30 and filaments 32. Lead 26*a* is fixed to the top of filament housing 30. Three filament brackets 102 extend downwardly from the top of filament housing 30. A filament mount 104** is mounted to each bracket 102. An insulation block 110 and a filament mount 108 are mounted to the opposite side of filament housing 30. The filaments 32 are mounted to and extend between filament mounts 104 and 108. A flexible lead 106 electrically connects lead 26*b* to filament mount 108. Filament brackets 102 have a spring-like action which compensate for the expansion and contraction of filaments 32 during use. A cylindrical bracket 112 supports housing 30 instead of leads 26*a*/26*b*.

Figure 9:
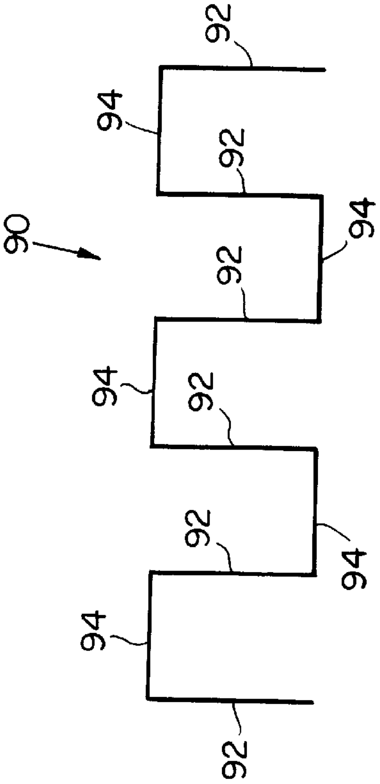
FIG. 9 is a schematic drawing of another preferred filament arrangement.

Referring to FIG. 9, filament arrangement 90 is another preferred method of electrically connecting multiple filaments together in order to increase the width of the electron beam over that provided by a single filament. Filaments 92 are positioned side-by-side and electrically connected in series to each other by electrical leads 94.

Figure 10:
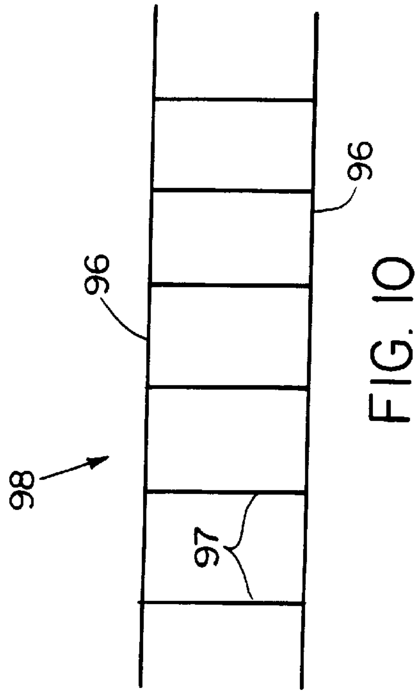
FIG. 10 is another schematic drawing of still another preferred filament arrangement.

Referring to FIG. 10, filament arrangement 98 depicts a series of filaments 97 which are positioned side-by-side and electrically connected together in parallel by two electrical leads 96. Filament arrangement 98 is also employed to increase the width of the electron beam.

Figure 11:
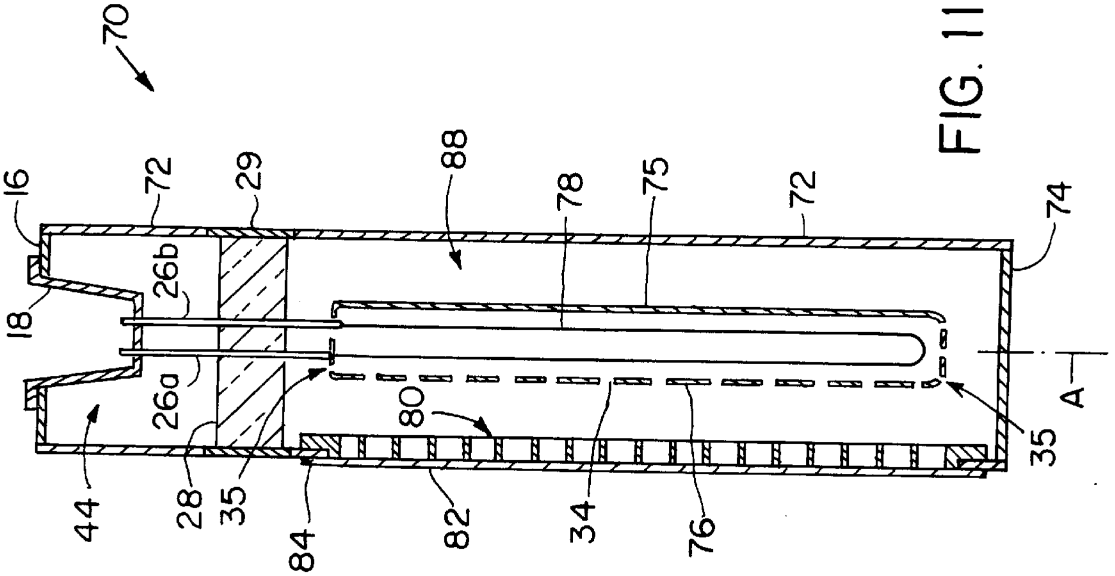
FIG. 11 is a side sectional view of another preferred electron beam accelerator.

Referring to FIG. 11, accelerator 70 is another preferred embodiment of the present invention. Accelerator 70 produces an electron beam which is directed at a 90° angle to the electron beam produced by accelerator 10. Accelerator 70 differs from accelerator 10 in that filaments 78 are parallel to the longitudinal axis A of the vacuum chamber 88 rather than perpendicular to the longitudinal axis A. In addition, exit window 82 is positioned on the outer shell 72 of the vacuum chamber 88 and is parallel to the longitudinal axis A. Exit window 82 is supported by support plate 80 which is mounted to the side of outer shell 72. An elongated filament housing 75 surrounds filaments 78 and includes a side 76 having grid openings 34 which are perpendicular to longitudinal axis A. The side openings 35 in filament housing 75 are perpendicular to openings 34. An end cap 74 closes the end of the vacuum chamber 88. Accelerator 70 is suitable for radiating wide areas with an electron beam without employing multiple staggered accelerators and is suitable for use in narrow environments. Accelerator 70 can be made up to about 3 to 4 feet long and can be staggered to provide even wider coverage.

The present invention electron accelerator is suitable for liquid, gas (such as air), or surface sterilization as well as for sterilizing medical products, food products, hazardous medical wastes and cleanup of hazardous wastes. Other applications include ozone production, fuel atomization and chemically bonding or grafting materials together. In addition, the present invention electron accelerator can be employed for curing inks, coatings, adhesives and sealants. Furthermore, materials such as polymers can be cross linked under the electron beam to improve structural properties.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

For example, although the present invention has been described to include multiple filaments, alternatively, only one filament can be employed. In addition, although the outer shells, end caps and filament housings are preferably made of stainless steel, alternatively, other suitable metals can be employed such as titanium, copper or KOVAR®. End caps 16 and 20 are usually welded to outer shell 14 but alternatively can be brazed. The holes 22*a* in support plate 22 can be non-circular in shape such as slots. The dimensions of filaments 32 and the outer diameter of accelerator 10 can be varied depending upon the application at hand. Also, other suitable materials can be used for insulator 28 such as glass. Although the thickness of a titanium exit window is preferably under 12.5 microns (between 6 and 12 microns), the thickness of the exit window can be greater than 12.5 microns for certain applications if desired. For exit windows having a thickness above 12.5 microns, high voltage power supply 48 should provide about 100 kv to 150 kv. If exit windows made of materials which are lighter than titanium such as aluminum are employed, the thickness of the exit window can be made thicker than a corresponding titanium exit window while achieving the same electron beam characteristics. Accelerators 10 and 70 are preferably cylindrical in shape but can have other suitable shapes such as rectangular or oval cross sections. Once the present invention accelerator is made in large quantities to be made inexpensively, it can be used as a disposable unit. Finally, receptacle 18 can be positioned perpendicular to longitudinal axis A for space constraint reasons.

What is claimed is:

1. An electron accelerator comprising:

a vacuum chamber having an electron beam exit window;

an electron generator positioned within the vacuum chamber for generating electrons; and a housing surrounding the electron generator, the housing having a first series of openings formed in the housing between the electron generator and the exit window for allowing electrons to accelerate from the electron generator out the exit window in an electron beam when a voltage potential is applied between the housing and the exit window, the housing also having a second and third series of openings formed in the housing on opposite sides of the electron generator for causing electrons to be uniformly distributed across the electron beam by flattening electrical field lines between the electron generator and the exit window.

2. The accelerator of claim 1 in which the vacuum chamber is formed within a cylindrical member, the cylindrical member having a longitudinal axis and an outer wall.

3. The accelerator of claim 2 further comprising a high voltage connector for supplying power to the electron generator and the housing, a disk-shaped high voltage insulator separating the vacuum chamber from the high voltage connector.

4. The accelerator of claim 3 further comprising only two leads passing through the insulator for electrically connecting the high voltage connector to the electron generator and the housing.

5. The accelerator of claim 3 further comprising a sealable outlet coupled to the vacuum chamber.

6. The accelerator of claim 1 in which the electron generator comprises a filament.

7. The accelerator of claim 2 in which the vacuum chamber is hermetically sealed to preserve a permanent self sustained vacuum therein.

8. The accelerator of claim 7 in which the exit window has an outer edge which is brazed to the vacuum chamber to provide a gas tight seal therebetween.

9. The accelerator of claim 8 further comprising a support plate mounted to the vacuum chamber for supporting the exit window.

10. The accelerator of claim 9 in which the exit window is positioned perpendicular to the longitudinal axis of the vacuum chamber.

11. The accelerator of claim 9 in which the exit window is positioned parallel to the longitudinal axis of the vacuum chamber.

12. The accelerator of claim 9 in which the exit window is formed of a metallic foil.

13. The accelerator of claim 12 in which the exit window is formed of titanium foil between about 6 to 12 microns thick.

14. The accelerator of claim 7 in which the exit window has an outer edge which is welded to the vacuum chamber to provide a gas tight seal therebetween.

15. The accelerator of claim 7 in which the exit window has an outer edge which is bonded to the vacuum chamber to provide a gas tight seal therebetween.

16. The accelerator of claim 1 in which the electron beam is substantially non-focused.

17. The accelerator of claim 1 in which the accelerator is a first electron accelerator for producing a first electron beam and further comprises a second electron accelerator for producing a second electron beam, the second accelerator being offset from the first accelerator backwardly and sidewardly to provide uninterrupted lateral electron beam coverage on an object moving under the electron beams.

18. An electron accelerator comprising:

a vacuum chamber having an electron beam exit window, the vacuum chamber being formed within a cylindrical member and hermetically sealed to preserve a permanent self sustained vacuum therein;

an electron generator positioned within the vacuum chamber for generating electrons;

a high voltage connector for supplying power to the electron accelerator;

a disk-shaped high voltage insulator separating the vacuum chamber from the high voltage connector; and a housing surrounding the electron generator, the housing having a first series of openings formed in the housing between the electron generator and the exit window for allowing electrons to accelerate from the electron generator out the exit window in an electron beam when a voltage potential is applied between the housing and the exit window, the housing also having a second and third series of openings formed in the housing on opposite sides of the electron generator for causing electrons to be uniformly distributed across the electron beam by flattening electrical field lines between the electron generator and the exit window.

19. An electron accelerator comprising:

a vacuum chamber having an electron beam exit window, the exit window being formed of metallic foil bonded in metal to metal contact with the vacuum chamber to provide a gas tight seal therebetween, the exit window being less than about 12.5 microns thick, the vacuum chamber being formed within an elongate member and hermetically sealed to preserve a permanent self sustained vacuum therein;

an electron generator positioned within the vacuum chamber for generating electrons;

a high voltage connector positioned within the elongate member for supplying power to the electron accelerator;

a high voltage insulator separating the vacuum chamber from the high voltage connector; and a housing surrounding the electron generator, the housing having a first series of openings formed in the housing between the electron generator and the exit window for allowing electrons to accelerate from the electron generator out the exit window in an electron beam when a voltage potential is applied between the housing and the exit window.

20. The accelerator of claim 19 in which the exit window is formed of titanium foil.

21. The accelerator of claim 20 in which the exit window is between about 8 to 10 microns thick.

22. The accelerator of claim 20 further comprising a high voltage power supply for applying the voltage potential between the housing and the exit window, the power supply supplying power between about 100 to 150 kv.

23. The accelerator of claim 21 further comprising a high voltage power supply for applying the voltage potential between the housing and the exit window, the power supply supplying power between about 80 to 125 kv.

24. The accelerator of claim 23 in which the electron generator comprises a filament about 8 inches long.

25. The electron generator of claim 24 in which the accelerator is no more than about 12 inches wide by about 20 inches long.

26. A method of accelerating electrons comprising the steps of:

providing a vacuum chamber having an electron beam exit window;

generating electrons with an electron generator positioned within the vacuum chamber;

surrounding the electron generator with a housing, the housing having a first series of openings formed in the housing between the electron generator and the exit window;

accelerating the electrons from the electron generator out the exit window in an electron beam by applying a voltage potential between the housing and the exit window; and uniformly distributing electrons across the electron beam by flattening electrical field lines between the electron generator and the exit window with a second and third series of openings formed in the housing on opposite sides of the electron generator.

27. The method of claim 26 further comprising the step of hermetically sealing the vacuum chamber to preserve a permanent self sustained vacuum therein.

28. The method of claim 26 in which the exit window has an outer edge, the method further comprising the step of brazing the outer edge to the vacuum chamber to provide a gas tight seal therebetween.

29. The method of claim 28 further comprising the step of supporting the exit window with a support plate mounted to the vacuum chamber.

30. The method of claim 29 further comprising the step of positioning the exit window perpendicular to the longitudinal axis of the vacuum chamber.

31. The method of claim 29 further comprising the step of positioning the exit window parallel to the longitudinal axis of the vacuum chamber.

32. The method of claim 27 further comprising the step of increasing the vacuum within the vacuum chamber by trapping ionized molecules contained within the vacuum chamber on surfaces of the housing.

33. The method of claim 26 in which the exit window has an outer edge, the method further comprising the step of welding the outer edge to the vacuum chamber to provide a gas tight seal therebetween.

34. The method of claim 26 in which the exit window has an outer edge, the method further comprising the step of bonding the outer edge to the vacuum chamber to provide a gas tight seal therebetween.

35. A method of accelerating electrons comprising the steps of:

providing a vacuum chamber having an electron beam exit window, the exit window being formed of metallic foil bonded in metal to metal contact with the vacuum chamber to provide a gas tight seal therebetween, the exit window being less than about 12.5 microns thick;

generating electrons with an electron generator positioned within the vacuum chamber;

surrounding the electron generator with a housing, the housing having a first series of openings formed in the housing between the electron generator and the exit window;

accelerating the electrons from the electron generator out the exit window in an electron beam by applying a voltage potential between the housing and the exit window;

hermetically sealing the vacuum chamber to preserve a permanent self sustained vacuum therein; and increasing the vacuum within the vacuum chamber by trapping ionized molecules contained within the vacuum chamber on surfaces of the housing.

36. An electron accelerator comprising:

a vacuum chamber having an electron beam exit window;

an electron generator positioned within the vacuum chamber for generating electrons; and a housing surrounding the electron generator, the housing having a first series of openings formed in the housing between the electron generator and the exit window for allowing electrons to accelerate from the electron generator out the exit window in an electron beam when a voltage potential is applied between the housing and the exit window, the housing also having a passive electrical field line shaper for causing electrons to be uniformly distributed across the electron beam.

37. The accelerator of claim 36 in which the passive electrical field line shaper comprises a second and third series of openings formed in the housing on opposite sides of the electron generator.

38. A method of accelerating electrons comprising the steps of:

providing a vacuum chamber having an electron beam exit window;

generating electrons with an electron generator positioned within the vacuum chamber;

surrounding the electron generator with a housing, the housing having a first series of openings formed in the housing between the electron generator and the exit window, the housing also having a passive electrical field line shaper;

accelerating the electrons from the electron generator out the exit window in an electron beam by applying a voltage potential between the housing and the exit window; and uniformly distributing electrons across the electron beam between the electron generator and the exit window with the passive electrical field line shaper.

39. The method of claim 38 in which the passive electrical field line shaper is formed by forming second and third series of openings in the housing on opposite sides of the electron generator.

40. A method of accelerating electrons comprising the steps of:

providing a vacuum chamber having an electron beam exit window, the exit window being formed of metallic foil bonded in metal to metal contact with the vacuum chamber to provide a gas tight seal therebetween, the exit window being less than about 12.5 microns thick, the vacuum chamber being formed within an elongate member and hermetically sealed to preserve a self sustained vacuum therein;

generating electrons with an electron generator positioned within the vacuum chamber;

positioning a high voltage connector within the elongate member for supplying power to the electron generator;

separating the vacuum chamber from the high voltage connector with a high voltage insulator; and surrounding the electron generator with a housing, the housing having a first opening formed in the housing between the electron generator and the exit window for allowing electrons to accelerate from the electron generator out the exit window in an electron beam when a voltage potential is applied between the housing and the exit window.

* * * * *